United States Patent
Poli et al.

(10) Patent No.: US 6,996,697 B2
(45) Date of Patent: Feb. 7, 2006

(54) METHOD OF WRITING A GROUP OF DATA BYTES IN A MEMORY AND MEMORY DEVICE

(75) Inventors: Salvatore Poli, Mascalucia (IT); Paolino Schillaci, Casteltermini (IT); Salvatore Polizzi, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 193 days.

(21) Appl. No.: 10/371,221

(22) Filed: Feb. 21, 2003

(65) Prior Publication Data

US 2003/0182533 A1 Sep. 25, 2003

(30) Foreign Application Priority Data

Feb. 21, 2002 (IT) .......................... VA2002A0016

(51) Int. Cl.
*G06F 12/00* (2006.01)
(52) U.S. Cl. ...................... 711/218; 711/103; 711/217; 365/239
(58) Field of Classification Search .................... 711/5, 711/103, 150, 168, 217, 218; 365/185.33, 365/189.04, 189.05, 230.08, 230.09, 239
See application file for complete search history.

(56) References Cited

U.S. PATENT DOCUMENTS

| | | | | |
|---|---|---|---|---|
| 4,369,504 A | * | 1/1983 | Hanmura | 365/219 |
| 6,131,127 A | * | 10/2000 | Gafken et al. | 710/1 |
| 6,157,970 A | * | 12/2000 | Gafken et al. | 710/27 |
| 6,469,954 B1 | * | 10/2002 | Wilford et al. | 365/233 |
| 6,621,761 B2 | * | 9/2003 | Akaogi et al. | 365/233 |
| 2002/0154547 A1 | * | 10/2002 | Hirano | 365/185.33 |

* cited by examiner

*Primary Examiner*—Gary Portka
*Assistant Examiner*—Jasmine Song
(74) *Attorney, Agent, or Firm*—Lisa K. Jorgenson; Allen, Dyer, Doppelt, Milbrath & Gilchrist, P.A.

(57) ABSTRACT

The invention provides a protocol cycle during which a memory address and all the data bytes to be written are transmitted, and the writing process is carried out only once for all the transmitted data bytes, by writing a first byte in the memory sector corresponding to a first address generated by resetting to zero the 2 least significant bits of the transmitted address and all the other transmitted bytes in successive addresses. The method includes writing a certain number N of data bytes, in consecutive memory addresses in a memory array of a memory device, and includes unprotecting the memory sectors in which data are to be written, communicating the programming command to the memory device, communicating to the memory device the bits to be stored and specifying a relative memory address of a sector to write in, and writing the data bits in the memory.

8 Claims, 3 Drawing Sheets

METHOD OF WRITING A GROUP OF DATA BYTES IN A MEMORY AND MEMORY DEVICE

FIELD OF THE INVENTION

The present invention relates to memory devices, and, more particularly, to methods of writing a group of data bytes in a memory of a memory device and memory devices that use a Low Pin Count (LPC) protocol.

BACKGROUND OF THE INVENTION

There are many applications for memory devices capable of storing large amounts of data in a nonvolatile way, to be provided to or made accessible at a later time to a processing system. Typical examples are memory devices for PCBios applications on PCI buses, for digital cameras, electronic agendas, measurement instruments, electronic appliances of vehicles and the like. At the present time, the type of memory devices that are most used in these applications are the so-called FLASH memories.

Independently from the protocol used for writing a byte of data in a FLASH memory, the following steps are performed: a first protocol cycle for unprotecting the sector or sectors of the matrix of memory cells in which data bits are to be written; a second protocol cycle for communicating the write command to the memory; a third protocol cycle for providing the address of the memory sector to be written, and the relative data byte; and carrying out a memory write algorithm for the data byte to be stored in the memory.

Depending on the protocol used, each cycle includes distinct phases, during which address bits and data bits or bits of command codes are sent to the memory alternated with synchronization bits, but substantially the data bits are written in the memory by performing the above mentioned steps. To better explain the technical problem being addressed herein, reference will be made hereinafter to an LPC communication protocol, though the same considerations are also valid, with appropriate changes, for all the protocols in which the writing of a data byte is carried out in the above mentioned way, such as the communication protocols between memory and processor on a motherboard.

FIG. 1 depicts a typical write cycle of LPC protocol during which an address and a relative byte to be written are input to the memory. The start phase START lasts a clock period CLK and is determined by the switching of an external command LFRAME. A phase CYCTYPE follows, which also lasts a clock period, during which it is specified whether the protocol cycle is a read (READ) or a write (WRITE) cycle, as in the shown example. During a third phase ADDR, which lasts 8 clock periods, the address bits of the sector to be written are transmitted in groups of 4 bits. Then three phases, namely: DATA, TAR and SYNC, are carried out, in a total of 5 clock periods, during which the memory receives the byte of data to be written and confirms that it has been received. Finally, with the last phase TAR, which lasts two clock periods, the memory device releases the control of the system bus that connects it to the external world.

On the whole, a write cycle of an LPC protocol lasts 17 clock periods and only one byte of data to be written is transmitted. Even an LPC protocol cycle for communicating to the memory device the codes of a command to be executed lasts 17 clock periods. Therefore, in known devices implementing an LPC protocol, for writing a certain number of bytes, it is necessary to repeat the above mentioned two cycles of protocol and the write algorithm for each data byte to be written. In practice, 34 clock periods plus the time taken for carrying out the write algorithm and unprotecting the memory sectors to be written on are necessary for each single byte.

Neglecting the time needed for unprotecting the memory sectors of interest, and supposing that a clock period last 1 $\mu s$, using a 1 Mhz programmer, and supposing that the write algorithm last 10 $\mu s$, to write a single data byte in the memory $$(2*17*1+10)\mu s = 44\ \mu s \quad (1)$$

are necessary. This write (programming) time of a single byte is relatively long. Considering that standard FLASH memory devices have usually a capacity in the order of Mbytes, programming a whole array of FLASH memory cells is a relatively long operation.

SUMMARY OF THE INVENTION

It is an object of the present invention to provide a method of writing a group of a certain number of data bytes, in a memory core of a memory device, wherein the data bytes are written at the same time and not a byte at the time.

This is made possible because the method of this invention contemplates a protocol cycle during which a memory address and all the data bytes to be written are transmitted, and the writing algorithm is carried out only once for all the transmitted data bytes, by writing a first byte in the memory sector corresponding to a first address generated by resetting to zero the 2 least significant bits of the transmitted address and all the other transmitted bytes in successive addresses. As it may be easily understood, in this way a non-negligible time saving is obtained in respect to the known methods.

More precisely, the invention is a method of writing a certain number N of data bytes, in consecutive memory addresses in a memory array of a memory device, comprising unprotecting the memory sectors in which data are to be written, carrying out a protocol cycle for communicating the programming command to the memory device, carrying out another protocol cycle for communicating to the memory device the bits to be stored and specifying a relative memory address of a sector to write in and carrying out a writing algorithm of data bits in the memory.

The method of this invention provides a faster writing operation of data in the memory because a memory address and the whole group of bytes to be written are transmitted in a single protocol cycle and the writing algorithm is carried out only once for all the data bytes of the group and comprises the operation of writing a first byte of the group in a first address generated by resetting the least significant bits of the address transmitted to the memory device, and the successive bytes in respectively consecutive memory addresses, following the first address.

A further object of the present invention is to provide a memory device using an LPC communication protocol, that implements the method of the invention for writing groups of bytes of data in a single operation instead of one byte at the time. This is made possible because in memory devices that use an LPC communication protocol, the standard memory core allows the writing of no more than four bytes of data at the time. The memory device of this invention, besides having a memory core, a storage circuit of addresses for where to write in and a data bus that transfers to the memory the bits of data to be written, also has a state machine that receives during a same cycle of the LPC protocol all the data bytes to be written, for a maximum number of four bytes, and a memory address, relative to a first data byte to be written.

Starting from the received address, the state machine generates all memory addresses in which data are to be written via an internal counter that changes the least significant address bits: the first data byte is written in an address obtained by internally resetting the 2 least significant bits of the received address, while the other bytes are written in consecutive addresses, following such a first address.

BRIEF DESCRIPTION OF THE DRAWINGS

The different aspects and advantages of the invention will appear even more evident through a detailed description of several embodiments of the invention and by referring to the attached drawings, wherein.

DETAILED DESCRIPTION OF THE PREFERRED EMBODIMENTS

With the method of this invention, the write operation of a plurality of data bytes in the memory is performed through only two protocol cycles after having unprotected the memory sector in which to write. With a first protocol cycle, the command to be executed is communicated to the memory device, while with the second protocol cycle all the data bytes to be written and a memory address are transmitted. The addresses of the sector in which to write are generated internally starting from the address that has been transmitted with the second protocol cycle. Finally the writing algorithm is carried out for all the bytes in a single operation. In this way, a plurality of bytes is written with only two cycles of the protocol, thus achieving a non-negligible time saving.

In the ensuing specification, the method of this invention will be described by referring to its implementation in a memory device destined to be used with an LPC (Low Pin Count) protocol. Given that in the considered memory devices that uses LPC communication protocols it is possible to write up to 32 bits with a single writing algorithm, hereinafter reference will be made to the case in which a group of four bytes at the time are to be written. Clearly, the method may be implemented also for groups of a different number N of bytes in devices that allow writing of 8*N bits at the time with a single writing algorithm.

Figure 1:
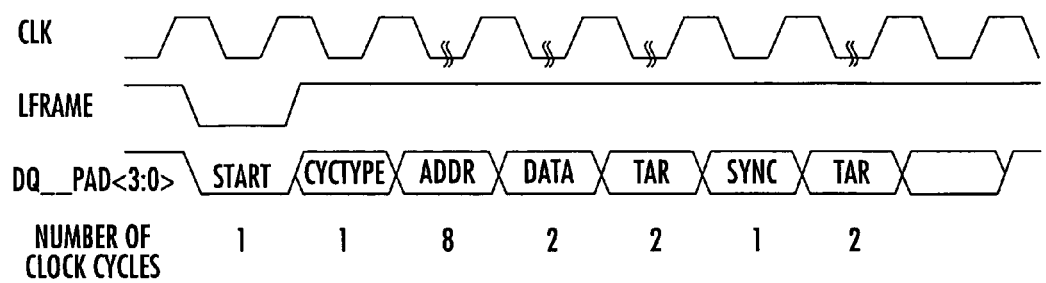
FIG. 1 illustrates a cycle of LPC protocol for transmitting a data byte according to a memory device of the prior art.
Figure 2:
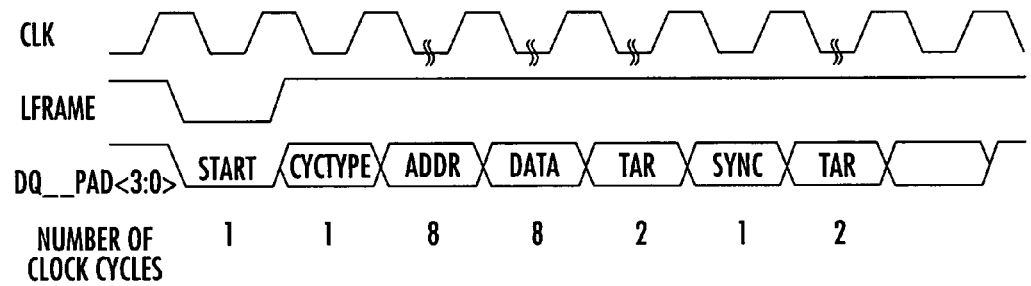
FIG. 2 illustrates a cycle of LPC protocol for transmitting four data bytes to a memory device according to this invention.

A example timing diagram for a cycle of an LPC protocol in which the address bits and four data bytes are transmitted is shown in FIG. 2. The shown sample cycle differs from that of FIG. 1 because the phase DATA lasts longer, 8 clock periods, and in it four data bytes are transmitted.

Figure 3:
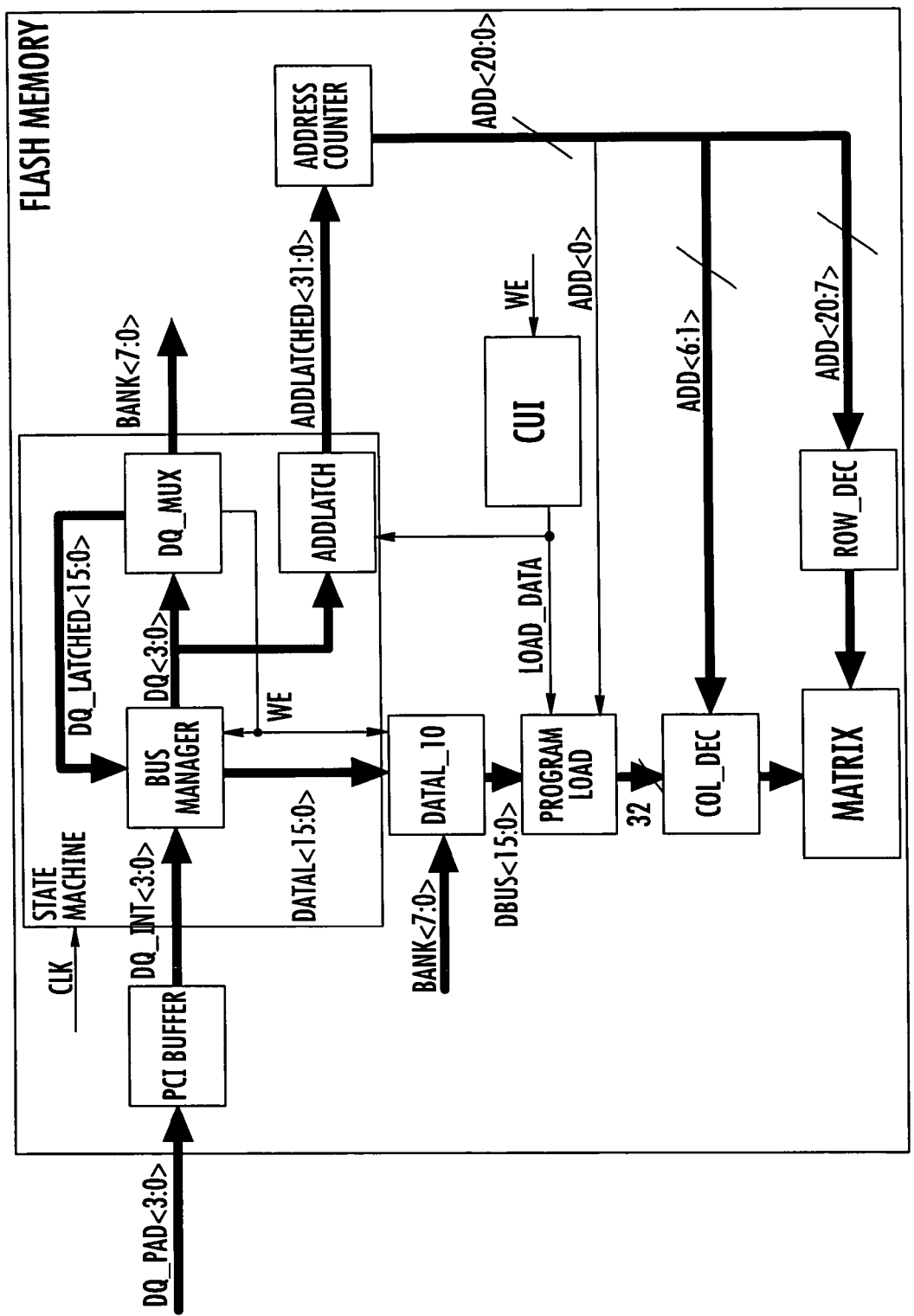
FIG. 3 is a block diagram of a memory device supporting an LPC transmission protocol according to this invention.

A block diagram of the LPC memory device of the invention is depicted in FIG. 3. It comprises a standard memory, formed by a single array of cells or more commonly by a number of array sectors, MATRIX, by row decoders ROW_DEC and column decoders, COL_DEC, by a programming circuit of the memory cells, PROGRAM_LOAD, and by a command interface, CUI, generating a load data pulse, LOAD DATA. Moreover, there are a multiplexing circuit DATAL_IO that sends to the memory the data bytes to be written and an address storage circuit ADDRESS_COUNTER of the sector of the array in which to write.

Differently from known memory devices, the device of the invention comprises a state machine STATE_MACHINE that is suitably designed for reading, during the same LPC protocol cycle, four bytes of data to be written and the bits of the transmitted address in which to write a first byte of data, and for generating from the transmitted address four consecutive memory addresses in which to store the four bytes of data. The first address to be internally generated by the state machine is obtained by resetting the 2 least significant bits of the transmitted address during the protocol cycle, while the other three addresses are successive to the first generated address.

It is essential to reset the 2 least significant bits of the transmitted address by the LPC protocol, otherwise the information on the internally generated successive memory addresses would be lost. The address and data bits are received by the memory device through the input bus DQ_PAD<3:0>. An input buffer PCI_BUFFER, designed to satisfy the PCI specifications (Peripherals Component Interconnect), replicates on a first internal bus DQ_INT<3:0> the read bits.

The state machine STATE_MACHINE is coupled to the bus DQ_INT<3:0> and receives an externally generated clock signal CLK. It reads the data and the address bits and provides the data bits to the multiplexing circuit DATAL_IO, through a second internal bus DATAL<15:0>, in groups of four bits at the time with a respective synchronization command BANK<7:0> for each group. These groups of bits are sent per bytes to the standard memory, through the data bus DBUS<15:0> when the respective synchronization commands are received by the circuit DATAL_IO and when a write enable command WE generated by the state machine is active.

In addition, the state machine generates the three other consecutive memory addresses from the read address, after having reset to zero the 2 least significant bits of the read address, via an internal counter that updates sequentially the least significant address bits. In this way the state machine sends in succession to the address storage circuit ADDRESS_COUNTER through the bus ADDLATCHED<31:0>, the addresses in which to write the data bytes present on the data bus DBUS<15:0>. When the state machine generates the write enable command WE, the command interface CUI generates a data load pulse LOAD_DATA in synchronization with it, making the byte available on the data bus DBUS<15:0> be loaded in the circuit PROGRAM_LOAD.

A particularly convenient mode of realizing the state machine of the memory device of the invention is depicted in FIG. 3. An interface BUS_MANAGER coupled to the internal bus DQ_INT<3:0> produces on the second internal bus DATAL<15:0> data bytes to be written in the memory when it receives the write enabling command WE. This interface BUS_MANAGER sends the address bits to an address generation circuit ADDLATCH, and the data bits on a bus DQ<3:0>. The address generation circuit ADDLATCH, which comprises the above mentioned counter, sends on the bus ADDLATCHED<31:0> all the memory addresses in which the data bytes are to be respectively written when it receives the load data pulse LOAD_DATA.

A synchronization circuit DQ_MUX comprises an array of latches organized in banks of four latches, receiving bits of data to be written through the bus DQ<3:0>, and a control circuit of these latches. Each bank of latches transfers to the interface BUS_MANAGER the data bits in groups of four, through a second data bus DQ_LATCHED<15:0>, when a respective synchronization command BANK<7:0> is received. The synchronization commands BANK<7:0> are generated by the control circuit that generates also the write enabling command WE.

To better illustrate the functioning of the state machine, reference will be made to the particular case in which the array of latches is composed of 16 latches. Given that the number of data bits to be written for a group of four bytes of information is 32, as the data bits are received by the circuit DQ_MUX they are immediately transferred on the bus DQ_LATCHED<15:0> in groups of four bits. So, after two clock pulses, the first data byte is present on the bus DQ_LATCHED<7:0> and, after 2 other clock pulses, the second byte is transferred on the bus DQ_LATCHED<15: 8> while the first byte has been already transferred on the data bus DBUS<7:0>. The lines DQ_LATCHED<7:0> receive the third byte while the lines DQ_LATCHED<15: 8> still contain the second byte, that is successively transferred on the bus DBUS<7:0>. Finally, during the successive 2 clock pulses, the fourth byte of data is loaded on the lines DQ_LATCHED<15:8> while the third byte is transferred on the bus DBUS<15:8>. In this way, while a data byte to be written is transferred on the data bus DBUS<15:0>, the successive data byte is transferred on the bus DQ_LATCHED<15:0> so not to slow down the transfer of bytes to the circuit PROGRAM_LOAD.

Figure 4:
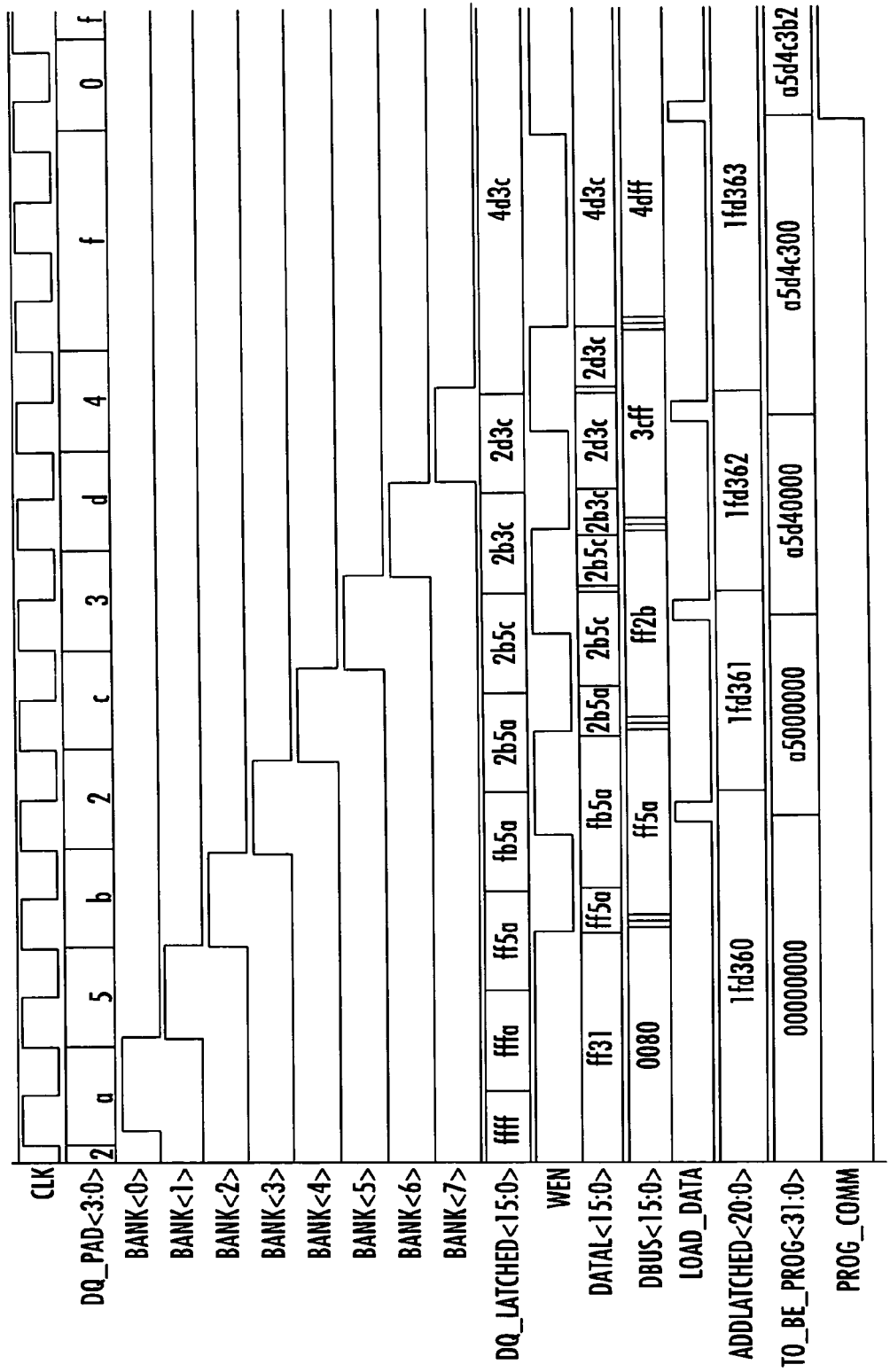
FIG. 4 is a timing diagram of the signals in the device of FIG. 3.

FIG. 4 represents a timing diagram of the main signals of the circuit of FIG. 3. As the bits read from the bus DQ_PAD<3:0> are acquired by the synchronization circuit DQ_MUX, it generates a respective synchronization command BANK and sends each group of four bits, indicated by a letter or a number of the exadecimal code, on the bus DQ_LATCHED<15:0>. When the interface BUS_MANAGER has received a first byte of data "5a", the synchronization circuit switches the logic inverted replica WEN of the write command WE, thus transferring the first data byte "5a" on the second internal bus DATAL<15:0> and from there on the data bus DBUS<15:0>.

The successive group of four bits "b" is placed on the bus DQ_LATCHED<15:0> while the signal WEN is still active, therefore it is immediately transferred on the bus DATAL<15:0>. On the leading edge of the signal WEN, the command interface CUI generates a load data pulse LOAD_DATA and allows the byte "5a" to be loaded in the circuit PROGRAM_LOAD. The content of the circuit PROGRAM_LOAD is depicted in FIG. 4 with the label TO_BE_PROG<31:0>. As it may be clearly noticed, the bits to be written in the memory are loaded in the circuit PROGRAM_LOAD in a negated form.

When the successive group of four bits "2" is transferred on the bus DQ_LATCHED<15:0>, the signal WEN is high and thus it is necessary to wait for this signal to switch so that it may be transferred on the bus DATAL<15:0>. Once that the byte "2b" is stored in the array of latches DATAL_IO, it is made available on the data bus DBUS<15: 0>. When the pulse LOAD_DATA is received, the byte "2b" is finally loaded in the circuit PROGRAM_LOAD, and so on for the other bytes. Meanwhile, the state machine provides on the bus ADDLATCHED<20:0> the address relating to the first data byte, generated by resetting to zero the least significant bits of the received address with the LPC cycle of FIG. 2, and the other consecutive addresses. When all four bytes to be written are loaded in the circuit PROGRAM_LOAD, the writing algorithm of the bytes in the memory cells is started by switching an appropriate signal PROG_COMM, as depicted in FIG. 3.

On the whole, by neglecting the operation of unprotection, the sample memory device of the invention that has been considered needs 17 clock pulses for the first LPC cycle, during which are transmitted the codes of the write command, 23 clock periods for the second LPC cycle, during which four data bytes are transmitted, plus 10 µs for carrying out the single write algorithm. Supposing that a clock period lasts 1 µs, for writing four bytes:

$$(17+23+10)\mu s = 50 \ \mu s \tag{2}$$

are necessary.

To quantify the advantages obtained by this invention, let us consider the case in which it is necessary to program a whole matrix of memory cells of a 2 Mbytes FLASH memory with a 1 MHz programmer, that is having a clock whose period is 1 µs. By neglecting the time required by the unprotection phase, in a known memory device implementing the LPC protocol, the time required would be:

$$(2 \cdot 10^6 \cdot 44)\mu s = 88s \tag{3}$$

By contrast, with the device of the invention, the time required will be:

$$\left(\frac{2 \cdot 10^6}{4} \cdot 50\right) \mu s = 25 \ s \tag{4}$$

In practice, the time required for programming a matrix of memory cells of 2 Mbytes is been reduced of about 70% in respect to the time required by an equivalent known memory device using an LPC communication protocol.

That which is claimed is:

1. A method of writing a group, having a certain number (N), of data bytes in a memory of a Low-Pin Count (LPC) memory device, the method comprising:
    carrying out a first protocol cycle for unprotecting a memory sector of the memory in which to write the group of data bytes;
    carrying out a second protocol cycle, after the first protocol cycle, for communicating a programming command to the memory device;
    carrying out a third protocol cycle, after the second protocol cycle, for transmitting to the memory device a memory address and the whole group of data bytes to be written;
    carrying out a writing phase of (8*N) data bits in the memory, the writing phase being carried out only once for the (N) data bytes and comprises writing a first byte of the group in a first address internally generated by resetting to zero the two least significant bits of the transmitted address, and writing the successive bytes respectively in memory addresses consecutive to the first internally generated address.

2. The method of claim 1, wherein the number (N) of bytes of the group is not greater than four.

3. A memory device using a Low Pin Count (LPC) communication protocol, comprising:
    a data bus;
    an address bus;
    a first internal bus;
    a second internal bus;

a memory receiving data via the data bus to be written in the memory based upon a load data pulse, and receiving respective internal addresses through the address bus, and including a command interface receiving a write enable command and generating the load data pulse in synchronization therewith;

an input buffer receiving the data to be written in the memory and receiving memory addresses through an input bus and providing the data and memory addresses on the first internal bus;

a state machine coupled to the first internal bus, generating, upon receiving the load data pulse, internal addresses in which to write bytes of the data, a write enable command, and synchronization commands, and producing on the second internal bus bytes of data to be written in the memory;

a multiplexing circuit for transferring bytes of the data from the second internal bus to the data bus, when respective synchronization commands are received and when the write enable command is active; and an address storage circuit for storing internal addresses generated by the state machine, and transferring the internal addresses on the address bus;

the state machine generating a first internal address to write a first byte by resetting to zero the two least significant bits of the memory address received through the first internal bus and comprising a sequential increment counter for sequentially updating the least significant bits of memory addresses, in response to the load data pulse, to generate successive internal addresses in which to write the successive bytes of data.

4. The device of claim 3, wherein the state machine further comprises;

an interface coupled with the internal bus, producing on the second internal bus bytes of data to be written in the memory when it receives the write enable command;

an address generating circuit defining the counter, receiving memory addresses from the interface and generating internal addresses upon receiving the load data pulse;

a second data bus; and a synchronization circuit including
an array of latches organized in banks of four latches each, each bank receiving from the interface bits of the data to be written and providing to the interface, through the second data bus the bits of data in groups of four bits when a respective synchronization command is received, and
a control circuit for the array of latches and generating the write enable command and the synchronization command for each group of bits.

5. The device of claim 4, wherein the command interface generates the load data pulse for a byte of data to be written in a certain internal address, while the synchronization circuit transfers on the second data bus the byte of data to be written in the successive internal address.

6. The device of claim 5, wherein the synchronization circuit comprises an array of 16 latches.

7. A memory device comprising;
a memory for storing data;
an input buffer receiving the data to be written in the memory and receiving memory addresses; and
a state machine connected to the input buffer for generating internal addresses from the memory addresses and supplying the data to be written in the memory, the state machine generating a first internal address for a first byte of data by resetting the least significant bits of the memory address received from the input buffer and generating successive internal addresses for successive bytes of data by incrementing the least significant bits of successive memory addresses received from the input buffer; the state machine comprising a synchronization circuit including an array of latches organized in banks of four latches each, each bank receiving bits of the data to be written and supplying bits of data in groups of four bits.

8. The device of claim 7, wherein the synchronzation circuit comprises an array of sixteen latches.

* * * * *